United States Patent [19]

Fudanuki

[11] Patent Number: 4,584,642
[45] Date of Patent: Apr. 22, 1986

[54] LOGIC SIMULATION APPARATUS

[75] Inventor: Nobuo Fudanuki, Yokohama, Japan

[73] Assignee: Tokyo Shibaura Denki Kabushiki Kaisha, Japan

[21] Appl. No.: 543,300

[22] Filed: Oct. 19, 1983

[30] Foreign Application Priority Data

Oct. 21, 1982 [JP] Japan .............................. 57-185103

[51] Int. Cl.[4] ............................................ G06F 15/20
[52] U.S. Cl. .................................................. 364/200
[58] Field of Search ... 364/200 MS File, 900 MS File

[56] References Cited

U.S. PATENT DOCUMENTS 4,306,286 12/1981 Cocke et al. ...................... 364/200

OTHER PUBLICATIONS

M. M. Denneau, "The Yorktown Simulation Engine," Proc. 19th Design Automation Conference pp. 55-59, Jun. 1982.
M. Abramovici et al., "A Logic Simulation Machine," Proc. 19th Design Automation Conference, pp. 65-73, Jun. 1982.

*Primary Examiner*—Raulfe B. Zache
*Attorney, Agent, or Firm*—Finnegan, Henderson, Farabow, Garrett & Dunner

[57] ABSTRACT

A logic simulation apparatus has a data memory for storing node level data of a logic circuit, a command memory for storing interconnection data which comprises an input data address, an output data address, a fan-out address and a function of module, and a data processing circuit for simulating the operation for each module in accordance with the commands read out from the command memory. The read address of the command memory is accessed by an address counter which is incremented by one for every read operation. The fan-out address read out from the command memory is written in an address queue, and when a simulation of one module is completed, the fan-out address is read out from the address queue and set in the address counter in order to start a simulation of a next module.

9 Claims, 5 Drawing Figures

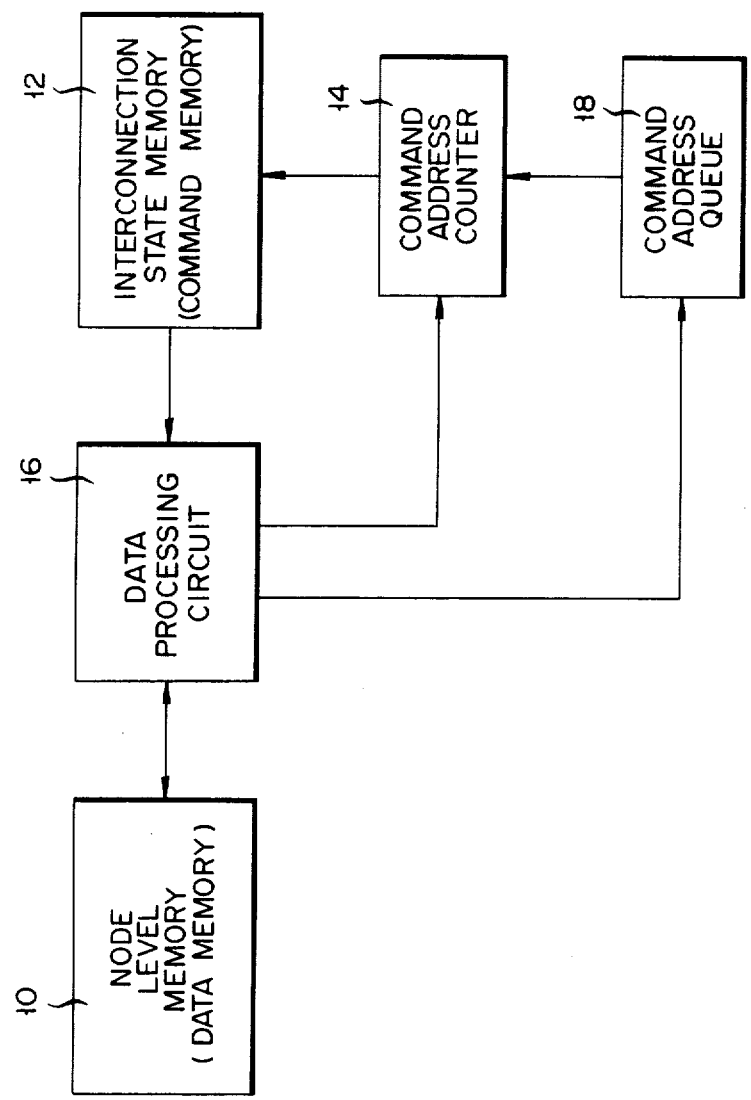

FIG. 2

| | |
|---|---|
| E | TIME, INPUT DATA, INPUT DATA ADDRESS |
| D | FAN-OUT ADDRESS |
| | ⋮ |
| D | FAN-OUT ADDRESS |
| | |
| | ⋮ |
| | |
| E | TIME, INPUT DATA, INPUT DATA ADDRESS |
| D | FAN-OUT ADDRESS |
| | ⋮ |
| F | END OF INPUT |
| A | INPUT DATA ADDRESS |
| | ⋮ |
| A | INPUT DATA ADDRESS |
| B | FUNCTION OF MODULE |
| C | OUTPUT DATA ADDRESS |
| D | FAN-OUT ADDRESS |
| | ⋮ |
| D | FAN-OUT ADDRESS |
| G | END OF MODULE |
| | ⋮ |
| A | INPUT DATA ADDRESS |
| | ⋮ |
| A | INPUT DATA ADDRESS |
| B | FUNCTION OF MODULE |
| C | OUTPUT DATA ADDRESS |
| G | END OF MODULE |

OP CODE      OPERAND

| C | OUTPUT DATA ADDRESS, DELAY TIME |

LOGIC SIMULATION APPARATUS

BACKGROUND OF THE INVENTION

The present invention relates to a logic simulation apparatus for simulating the operation of a logic circuit.

Conventionally, the operation of a logic circuit is programmed by software of a general large computer so as to simulate the operation of the logic circuit. A table-driven algorithm, as described in "Digital Logic Simulation In a Time-Based, Table-Driven Environment Part 1. Design Verification" by S. A. Szygenda and E. W. Thompson, *Computer* PP. 24–36, March 1975, is well-known as software simulation of this type. According to this algorithm, module data are stored in tables, and tables are selectively read out in accordance with the relationship of interconnections of the modules. The data (i.e., data constituting the corresponding table) of each module include module function data (AND, OR, etc.), interconnection data, input/output data, etc.

In the software simulation described above, the processing time per one logic module for data transfer, data processing, etc. is considerably longer than the operation time of the actual module. For this reason, the simulation time is increased in accordance with an increase in a circuit scale, resulting in inconvenience.

SUMMARY OF THE INVENTION

It is an object of the present invention to provide a logic simulation apparatus utilizing table data used in table-driven software simulation and adapted to shorten a simulation time.

In order to achieve the above object of the present invention, there is provided a logic simulation apparatus comprising a data memory for storing node levels of a logic circuit to be simulated, a command memory for storing as a command an interconnection state of modules of the logic circuit, a data processing circuit for processing a logical operation by using data read out from the data memory in accordance with the command read from the command memory, thereby simulating an operation of one module of the logic circuit, and a command address queue for reading out a command of a next module from the command memory in accordance with the processing result of the data processing circuit so as to start a simulation of the next module.

BRIEF DESCRIPTION OF THE DRAWINGS

FIG. 1 is a block diagram schematically showing a logic simulation apparatus according to a first embodiment of the present invention;

FIG. 2 shows a memory map of a command memory of the apparatus shown in FIG. 1;

DETAILED DESCRIPTION OF THE PREFERRED EMBODIMENTS

Figure 3:
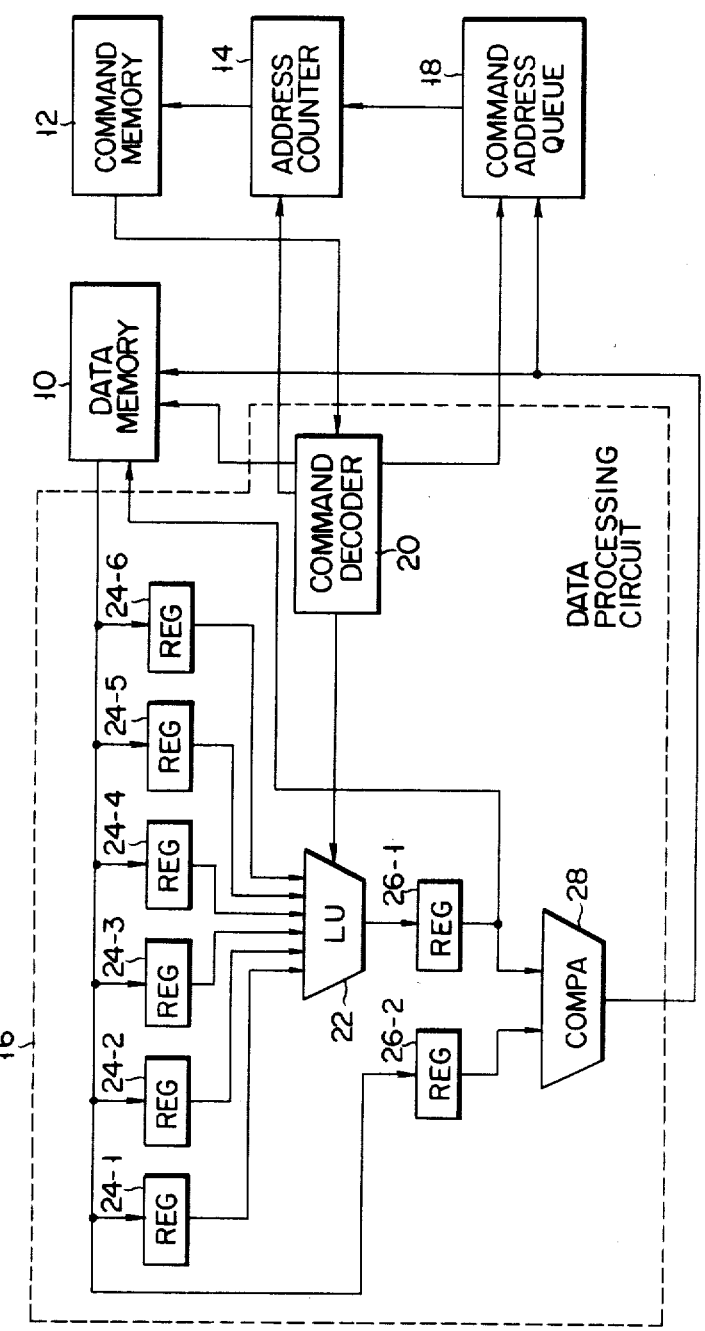
FIG. 3 is a detailed block diagram showing a data processing circuit of the apparatus shown in FIG. 1.

An embodiment of a logic simulation apparatus according to the present invention will be described with reference to the accompanying drawings. FIG. 1 is a block diagram of the logic simulation apparatus according to a first embodiment. In this embodiment, a propagation delay time within the circuit is not considered (the delay time is regarded as being zero). The circuit state of the logic circuit to be simulated is represented by node levels. Node levels are stored as data in a node level memory (data memory) 10. On the other hand, a conventional table-driven algorithm table, representing the interconnection state of the circuit, is stored as a command in an interconnection state memory (command memory) 12. The command in the command memory 12 has the conventional table data as an operand. The commands of the modules are stored at successive memory addresses.

FIG. 2 shows a memory map of the command memory 12. The commands of the modules are sequentially stored at addresses such that command of the module connected to an input terminal is stored first. The operand of a command A indicates an address (of the data memory 10) at which an input data of a module is stored. The operand of a command B indicates a function of the module. The operand of a command C indicates an address (of the data memory 10) at which an output data of the module is stored. A fan-out address of the operand of a command D indicates a connection destination of the module. More particularly, the fan-out address indicates an address of the start command A of a set of commands of an module connected to the output terminal of the module. The operand of a command E indicates a time at which an external input data is changed, the external input data and the input data address (of the data memory 10). A command F indicates the end of an external input. A command G indicates the end of processing for each module. The input data address is the same as the immediately preceding output data address in accordance with the interconnection relationship.

Referring again to FIG. 1, a read address of the command memory 12 is generated by a command address counter 14. The command read out from the command memory 12 is decoded by a data processing circuit 16. The data in the data memory 10 is logically processed in accordance with a decoded result. When the data processing circuit 16 completes operation for a given module, it controls a command address queue 18 to start operation of the next module. The count of the command address counter 14 is then updated.

FIG. 3 is a detailed block diagram of the data processing circuit 16. The data processing circuit 16 comprises a command decoder 20, a logic unit (LU) 22, input registers 24-1 to 24-6 (the number of input registers is not limited to six), output registers 26-1 and 26-2 and a comparator 28. The data output terminal of the data memory 10 is connected to the input terminals of the input registers 24-1 to 24-6 and the output register 26-2. The output terminals of the input registers 24-1 to 24-6 are connected to the input terminals of the LU 22, respectively. The output terminal of the LU 22 is connected to the input terminal of the output register 26-1. Output signals from the output registers 26-1 and 26-2 are supplied to the comparator 28. The output signal from the output register 26-1 is also supplied to the data memory 10. An output command from the command memory 12 is supplied to the command decoder 20. Outputs from the command decoder 20 and the comparator 28 are used for controlling various operations.

The operation of the logic simulation apparatus according to the first embodiment of the present invention will now be described. The commands corresponding to the interconnection state of the logic circuit to be simulated are stored in the command memory 12, as shown in FIG. 2. The command E is stored at the start address (0) of the command memory 12. The initial count of the address counter 14 is zero. Data stored in the data memory 10 is zero or indeterminate. An address of the command memory 12 is specified by the address counter 14, and then the corresponding command is read out from the command memory 12. The readout command is supplied to the command decoder 20. When this command is the command E (the command E is accessed first), the input data and the input data address of the operand are supplied to the data memory 10. In other words, the input data is stored at the input data address in the data memory 10. When the command decoder 20 receives one command, it increments the count of the command address counter 14 by one. The command D is then fetched by the command decoder 20. The command D indicates which module the input terminal is connected. The fan-out address is supplied to the command address queue 18. The commands D are fetched by the number of times corresponding to the number of fan-outs. In this case, when a plurality of input terminals are used, the cycle of command operation described above is repeated. When fan-out commands concerning all the input terminals are fetched, the command F is then fetched. The command F indicates the end of external input processing (fan-out processing) of the input terminal. When the command F is fetched, the fan-out address has been stored in the command address queue 18. For this reason, when the command F is fetched by the command decoder 20, the command decoder 20 does not cause the address counter 14 to increment but causes the command address queue 18 to read out one fan-out address. The command address queue 18 comprises a FIFO (first-in-first-out) memory which reads out data in the same order as an input order.

The fan-out address read out from the command address queue 18 is set in the address counter 14. A command stored at this fan-out address is read out from the command memory 12. Therefore, when external input operation is completed, the command set of any one of the modules is read out in accordance with the interconnection state. In this case, as shown in FIG. 2, the command set of each module comprises the commands A, B, C, D and G. When the command A is read out, the command decoder 20 supplies an input data address to the data memory 10. The input data of the module is then read out from the data memory 10 and is stored in one of the input registers 24-1 to 24-6. When the command decoder 20 decodes the command A, B, C or D, the command decoder 20 increments the count of the address counter 14 by one. When the commands A are fetched by a number of times corresponding to the number of input terminals, the command B is fetched. In this case, the command decoder 20 supplies a logic operation designation signal to the LU 22 in accordance with the function of the module. The LU 22 logically processes the input data stored in the input registers 24-1 to 24-6. An output (operation result) from the LU 22 is stored in the output register 26-1. Each module has one command B and one command C. The command C is fetched immediately after the command B. The command decoder 20 supplies an output data address to the data memory 10, so that the data memory 10 reads out the corresponding output data which is then stored in the output register 26-2. Therefore, the output register 26-2 stores the output data prior to the logical operation, while the output register 26-1 stores the output data obtained after the logical operation. The data stored in the output registers 26-1 and 26-2 are compared by the comparator 28. When the comparator 28 detects a noncoincidence of the data in the output registers 26-1 and 26-2, the data in the output register 26-1 are stored at the output data address in the data memory 10. In other words, the output data of the module is thus updated. Therefore, the input data of the next module is updated accordingly. Data updating means that a change in circuit state (node level) is signalled to the next stage. However, when the comparator 28 detects a coincidence between the data in the output registers 26-1 and 26-2, a change in the circuit state need not be signalled to the next stage. In other words, no data updating is performed, and the operation for the next module is started. The operation for the next module is started by reading out one fan-out address from the command address queue 18. Therefore, when the comparator 28 detects the above-mentioned coincidence, the command D is neglected. However, when a coincidence is not obtained and data updating is performed, the command D is fetched, and the fan-out address is stored in the command address queue 18. The fan-out address stored in the command address queue 18 serves to specify a module to which a change in the node level is signalled. When all fan-out addresses of this module are stored in the command address queue 18, the command G is fetched, thereby completing operation of this module. For this reason, when the command G is decoded, the fan-out address is read out from the command address queue 18, and the operation for the next module is started.

When the address is read out from the command address queue 18 in this manner, the operations of the modules are sequentially performed. A change in circuit state which is caused by the operation of the module is sequentially signalled by the fan-out address signal to the following module. However, the module connected to the output terminal does not have the fan-out address and has a command set wherein the command D is absent and an end-of-module command G follows the command C, as shown in the lower part of the map in FIG. 2.

The above operation continues until the command address queue 18 becomes empty, and logic circuit simulation is completed. Thereafter, design verification can be performed by referring to the data stored in the data memory 10.

According to this embodiment, a high-speed logic simulation apparatus is provided wherein conventional table-driven algorithm data is processed by hardware in the form of command execution unlike in conventional software simulation. The command set in this embodiment is subject to cross-compilation by using a program for converting a interconnection state of the modules to an internal data used in the conventional software simulation scheme. Therefore, a special conversion program for converting the interconnection state to corresponding commands need not be developed.

A compact, inexpensive logic simulation apparatus can be arranged by a large scale integrated circuit. The conventional software simulation apparatus requires a large computer, resulting in large construction and high cost. However, the simulation apparatus according to this embodiment allows the designer to readily perform a simulation, so that a customer can design a custom LSI, thereby developing the custom LSI.

Figure 4:
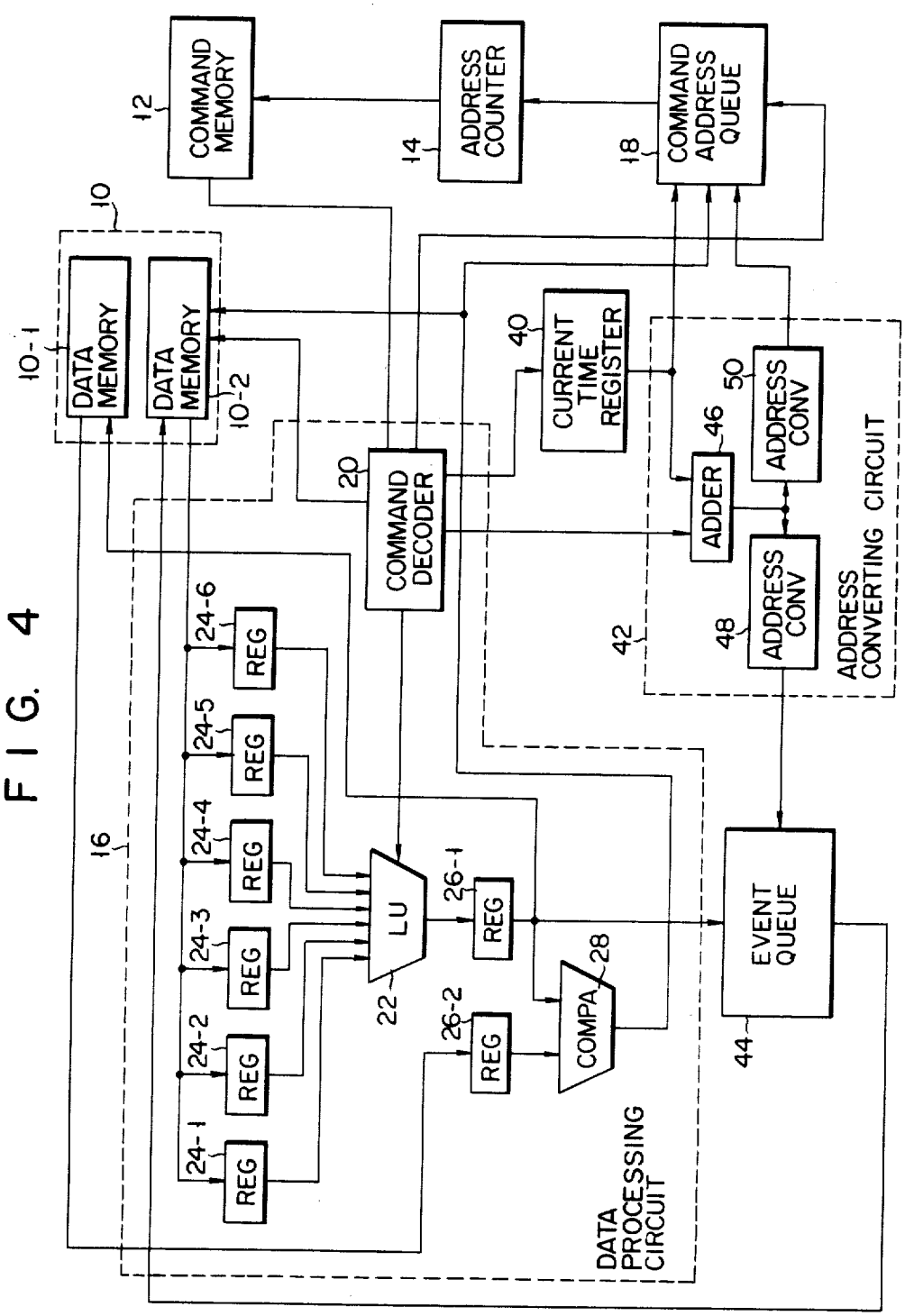
FIG. 4 is a block diagram showing a logic simulation apparatus according to a second embodiment of the present invention.

A logic simulation apparatus of a second embodiment of the present invention is shown in FIG. 4. The same reference numerals as used in FIG. 1 denote the same parts in FIG. 4. In the second embodiment, a unit for performing time management is added in consideration of circuit propagation delay time. A current time register 40 is connected to a command decoder 20. An address converting circuit 42 is connected to the command decoder 20 and the current time register 40. In this embodiment, the operation result is not immediately written in a data memory. In order to delay the operation result, an event queue 44 is arranged between an output register 26-1 and a data memory 10. The event queue 44 and a command address queue 18 are divided into a plurality of areas (pages) corresponding to predetermined times. These pages are accessed by the address converting circuit 42. The address converting circuit 42 comprises an adder 46 for adding the data from the command decoder 20 and the current time register 40 and address converters 48 and 50 respectively corresponding to the event queue 44 and the command address queue 18. The data memory 10 comprises a data memory 10-1 for immediately storing the logical operation result and a data memory 10-2 for storing a delayed logical operation result. The data memories 10-1 and 10-2 have the same addresses for the same node level. When the delay time has elapsed after the logical operation, the same data are stored at the same addresses of the data memories 10-1 and 10-2.

Figure 5:
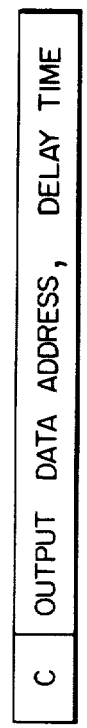
FIG. 5 shows a data format of a command C in the second embodiment.

The apparatus of the second embodiment has the same memory map as that (FIG. 2) of the command memory 12, except that the delay time (signal propagation delay time of the module) is added to the operand of a command C. FIG. 5 shows a data format of the command C of the apparatus according to the second embodiment.

The operation of the logic simulation apparatus according to the second embodiment will now be described. The current time register 40 is set to be zero at the start time. The processing up to the external input processing (command F) is the same as that in the first embodiment. In this case, the input data are stored in the data memory 10-2. The externally supplied fan-out address is stored in the page of time 0 of the command address queue 18. Assume that one fan-out address signal is read out from the command address queue 18 in response to the command F, and that operation for the first module is started. The commands A and B are processed in the same manner as in the first embodiment. When the command C is decoded, the corresponding output data is transferred from the data memory 10-1 to an output register 26-2. The data in the output register 26-2 are compared by a comparator 28 with the data in an output register 26-1. Meanwhile, the delay time data in the operand of the command C is supplied to the address converting circuit 42 and is added by the adder 46 to the current time data. The addition indicates that the delay time of the module is considered. The pages of the queues 44 and 18 which store data with respect to this module are determined by the address converters 48 and 50, respectively, in accordance with an output from the adder 46. When the comparator 28 detects a noncoincidence, the output data from the output register 26-1 is stored in the event queue 44 and the data memory 10-1. However, when the comparator 28 detects a coincidence, the fan-out address signal is read out from the page (designated by the current time register 40) of the command address queue 18, and the logical operation for the next module can be started.

When a noncoincidence is established, the command D is decoded, and the fan-out address is written in the page of the command address queue 18 which is obtained by the current time and the delay time, i.e., the output from the adder 46. Thereafter, when the end-of-module command G is decoded, the fan-out address is read out from the page (determined by the current time) of the command address queue 18. In this manner, when the logical operation of the modules is performed, and the page of the command address queue 18 which is determined by the current time becomes empty, the current time register 40 is incremented by one, and the above operation (the logical operation is started with readout of the fan-out address from the address queue 18) is repeated. The output data written in the event queue 44 is stored in the data memory 10-2 when the value of the current time register 40 indicates the written page.

When the above operation is repeated, and the command address queue 18 becomes empty, logical operation is completed.

According to the second embodiment, updating of the output data (input data of the next stage) is delayed by the event queue 44 by the signal propagation delay time of the actual module. For this reason, changes in circuit state can be accurately transmitted through the logic circuit. In the output value used for comparison to determine whether or not the fan-out address is written in the queue, the delay time need not be considered, so that the data stored in the data memory 10-1 directly connected to the output register 26-1 is used. The same effect as in the first embodiment can be obtained in the second embodiment.

The present invention is not limited to the particular embodiments described above. Various changes and modifications may be made within the spirit and scope of the present invention. For example, data depending on attributes of the circuit module may be stored in the data memory 10 instead of data indicating the circuit state. In this case, the LU 22 is replaced by an ALU and the arithmetic operation is performed by the ALU. In this arrangement, testability i.e., values depending upon interconnections such as a procedure for controlling a given node in accordance with the external input signal, or a procedure for observing the given node can be obtained. The arithmetic command for obtaining testability can be provided independently of the simulation commands within the same apparatus.

What is claimed is:

1. A logic simulation apparatus comprising:
    data memory means for storing node level data of a logic circuit to be simulated;
    command memory means for storing as a command an interconnection state of modules of said logic circuit;
    address counter means for supplying a read address to said command memory means;
    data processing means for processing data read out from said data memory means in accordance with the command read out from an address of said command memory means which is accessed by said address counter means; and an address queue for setting data in said address counter means in accordance with a data processing result of said data processing means.

2. An apparatus according to claim 1, in which said command memory means stores commands having operands which comprise an input data address, an output data address, a function of module and a fan-out address, and said data processing means logically operates data read out from said input data address of said data memory means in accordance with the function of module, thereby writing the logical operation result at the output data address of said data memory means and the fan-out address in said address queue.

3. An apparatus according to claim 2, in which said address counter means is incremented by one when one command is read out from said command memory means, and a first written fan-out address in said address queue is read out from said address queue and is set in said address counter means when all commands of one module are read out from said command memory means.

4. An apparatus according to claim 3, in which said data processing means compares output data obtained as the logical operation result with output data prior to logical operation, writes the fan-out address in said address queue when a noncoincidence is established, and immediately reads out the fan-out address from said address queue to set the fan-out address in said address counter means when a coincidence is established.

5. An apparatus according to claim 1, in which there is further provided a current time register for controlling time; said command memory means stores commands having operands which comprise an input data address, an output data address, a function of module, a delay time and a fan-out address; said data processing means logically operates data read out from the input data address of said data memory means in accordance with the function of module, thereby writing the logical operation result at the output data address of said data memory means at a time delayed by the delay time; and said address queue is divided into pages respectively corresponding to given times, the fan-out address being written in a page corresponding to the delay time.

6. An apparatus according to claim 5, in which said address counter means is incremented by one when one command is read out from said command memory means, and the fan-out address is read out from a page of said address queue which is designated by said current time register and the fan-out address is set in said address counter when all commands of one module are read out from said command memory means.

7. An apparatus according to claim 6, in which said data processing means compares output data obtained as the logical operation result with output data prior to logical operation, writes the fan-out address in said address queue when a noncoincidence is established, and immediately reads out the fan-out address from said address queue to set the fan-out address in said address counter means when a coincidence is established.

8. An apparatus according to claim 6, in which said current time register is incremented by one when the page of said address queue which is designated by said current time register becomes empty.

9. An apparatus according to claim 5, in which there is further provided an event queue which is divided into pages respectively corresponding to given times, the logical operation result of said data processing means is written in a page of said event quene which is a sum of the delay time and a current time, and data in the page of said event queue are written in said data memory means when a value of said current time register indicates a value corresponding to the page.

* * * * *